(12) United States Patent
Park

(10) Patent No.: US 6,967,388 B2
(45) Date of Patent: Nov. 22, 2005

(54) SEMICONDUCTOR DEVICES AND METHODS FOR FABRICATING THE SAME

(75) Inventor: Weon-Ho Park, Suwon (KR)

(73) Assignee: Samsung Electronics Co., Ltd., (KR)

(*) Notice: Subject to any disclaimer, the term of this patent is extended or adjusted under 35 U.S.C. 154(b) by 186 days.

(21) Appl. No.: 10/694,321

(22) Filed: Oct. 27, 2003

(65) Prior Publication Data

US 2004/0084748 A1    May 6, 2004

Related U.S. Application Data

(62) Division of application No. 10/321,077, filed on Dec. 17, 2002, now Pat. No. 6,660,589.

(30) Foreign Application Priority Data

Dec. 19, 2001 (KR) .................. 2001-81319

(51) Int. Cl.[7] .................................... H01L 29/00
(52) U.S. Cl. ................ 257/528; 257/390; 257/536
(58) Field of Search ................. 257/390, 506, 257/528, 529, 536, 537, 538

(56) References Cited

U.S. PATENT DOCUMENTS

| | | | | |
|---|---|---|---|---|
| 5,200,355 A | * | 4/1993 | Choi et al. ................ | 257/391 |
| 5,350,703 A | * | 9/1994 | Lee ..................... | 257/E21.672 |
| 5,866,456 A | * | 2/1999 | Abe ..................... | 438/275 |
| 6,432,778 B1 | * | 8/2002 | Lai et al. ............... | 257/E21.673 |
| 6,440,798 B1 | * | 8/2002 | Lai et al. ............... | 257/E21.679 |
| 6,489,251 B2 | * | 12/2002 | Chang .................. | 257/E21.671 |
| 6,576,511 B2 | * | 6/2003 | Pan et al. ................ | 438/257 |
| 6,717,222 B2 | * | 4/2004 | Zhang .................... | 257/390 |

* cited by examiner

Primary Examiner—Kevin M. Picardat
(74) Attorney, Agent, or Firm—Mills & Onello LLP

(57) ABSTRACT

Semiconductor devices and methods for fabricating the same include a device isolation layer formed at a predetermined region of a semiconductor substrate to define a cell active region, a resistor active region, and an MROM active region. The device further includes a floating junction region, a resistive junction region, and a channel junction region, which are formed in the cell active region, the resistor active region, and the MROM active region, respectively. The floating junction region, the resistive junction region, and the channel junction region have the same thickness. A covering gate and an MROM gate cross over the resistive active region and the channel active region, respectively. Also, a memory gate and a select gate cross over the cell active region. The method includes forming a device isolation layer at a predetermined region of a semiconductor substrate to define a cell active region, a resistor active region, and an MROM active region. A floating junction region, a resistive junction region, and a channel junction region are then formed in the cell active region, the resistor active region, and the MROM active region, respectively. Thereafter, a select gate and a memory gate are formed on the cell active region. Also, a covering gate and an MROM gate are formed on the resistor active region and the MROM active region, respectively. The floating junction region, the resistive junction region, and the channel junction region are preferably formed at the same time.

12 Claims, 13 Drawing Sheets

Cell Active Region

Resistive Active Region

MROM Active Region

Cell Active Region

Resistive Active Region

Resistive Active Region

MROM Active Region

Cell Active Region

Resistive Active Region

MROM Active Region

SEMICONDUCTOR DEVICES AND METHODS FOR FABRICATING THE SAME

RELATED APPLICATION

This application is a divisional of U.S. application Ser. No. 10/321,077, filed on Dec. 17, 2002, now U.S. Pat. No. 6,660,589, which relies for priority upon Korean Patent Application No. 01-81319, filed on Dec. 19, 2001, the contents of which are herein incorporated by reference in their entirety.

FIELD OF THE INVENTION

The present invention relates to semiconductor devices and methods for fabricating the same and, more particularly, to semiconductor devices including nonvolatile memory transistors, resistors, and mask ROMs (MROMs) and methods for fabricating the same.

BACKGROUND OF THE INVENTION

Like identification cards, credit cards, and electronic cash, applications of smart cards having multiple functions have been on the increase. Smart cards not only store data of users and transactions, but also include programs adequate for inherent functionality. Smart cards therefore comprise semiconductor devices having both nonvolatile memory transistors for recording and storing data and MROMs for storing program data. In addition, the semiconductor devices used in the smart cards further include resistors for effecting their operation.

A nonvolatile memory transistor employed in a smart card is preferably an electrically erasable programmable read-only memory (EEPROM) of a floating gate tunnel oxide (FLOTOX) type (hereinafter inclusively referred to as a FLOTOX-type EEPROM), which offers a stable characteristic of data storage. In addition, the resistor preferably comprises a junction region formed in a semiconductor substrate, i.e., a junction resistor, so as to have an appropriate resistance value. Meanwhile, to store binary data (i.e., "1" or "0"), the MROM device employs a depletion-mode MOSFET or an enhancement-mode MOSFET.

FIG. 1 is a cross-sectional view of a typical FLOTOX-type EEPROM.

Referring to FIG. 1, a device isolation layer 15 is disposed at a predetermined region of a semiconductor substrate 10 to define an active region. A memory gate 50 and a select gate 51 are disposed to cross over the active region and the device isolation layer 15. A gate oxide layer 30 is intervened between the memory gate 50 and the active region and between the select gate 51 and the active region. A tunnel oxide layer 35, which is surrounded by the gate oxide layer 30, is disposed between the active region and the memory gate 50. The thickness of the tunnel oxide layer is less than that of the gate oxide layer 30.

Generally, the memory gate 50 and the select gate 51 are disposed in parallel with each other. The memory gate 50 includes a floating gate 40, a gate interlayer insulation layer 41, and a control gate 42. The floating gate 40 covers an entire top surface of the tunnel oxide layer 35. Also, the select gate 51 includes a lower select gate 43, a select gate interlayer insulation layer 44, and an upper select gate 45.

A floating junction region 20, of which conductivity type is different from that of the semiconductor substrate 10, is disposed in the active region under the tunnel oxide layer 35. The floating junction region 20 extends through the active region between the memory gate 50 and the select gate 51. A source/drain junction region 60 is disposed in the active region about the select gate 51 and the memory gate 50.

FIG. 2 is a cross-sectional view of a typical resistor of a semiconductor device.

Referring to FIG. 2, a device isolation layer 15 is disposed at a predetermined region of a semiconductor substrate 10 to define an active region. A gate oxide layer 30 is disposed on the active region. A resistive junction region 70 including impurities having a conductivity type that is different from that of the semiconductor substrate 10, is disposed in the active region. Also, resistor-connecting terminals 75 are disposed at both edges of the resistive junction region 70 such that they penetrate the gate oxide layer 30 to connect to the resistive junction region 70.

To use the resistive junction region 70 as a semiconductor device resistor, the sheet resistance of the resistive junction region 70 preferably ranges from 500 to 1000 ohm per square. Meanwhile, since a conductive material, for example, a polysilicon material including impurities, has a sheet resistance of about 10 ohm per square, in case of using the conductive material for the resistive junction region, resistance patterns should be formed in excessively long patterns.

The resistance of the resistive junction region 70 is determined by the concentration of impurities included therein. Accordingly, to maintain a precise resistance, it is necessary to control the amount and species of the impurities being doped into the resistive junction region 70. However, according to conventional approaches, a gate pattern or the like, which may serve as a mask for the ion implantation process, is not formed on the resistive junction region 70. As a result, the resistive junction region 70 may be exposed during subsequent ion implantation processes, leading to loss of control over providing the desired resistance in the resistive junction region 70.

FIG. 3 is a cross-sectional view of a typical MROM transistor.

Referring to FIG. 3, a device isolation layer is disposed at a predetermined region of a semiconductor substrate 10 to define an active region. An MROM gate oxide layer 35 is disposed on the active region. On the MROM gate oxide layer 35, MROM gate patterns 47 are disposed to cross the active region and the device isolation layer. An MROM junction region 62 having impurities of a conductivity type that is different from that of the semiconductor substrate 10, is disposed in the active region between the MROM gate patterns 47. The MROM junction region 62 serves as a source/drain region of the MROM transistor.

A channel junction region 80, which is in contact with the MROM junction region 62, may be additionally disposed in the active region under the MROM gate pattern 47. A depletion mode MOSFET includes the channel junction region 80, while an enhancement mode MOSFET does not include the channel junction region 80. Here, the channel junction region 80 includes impurities having a conductivity type that is the same as that of the MROM junction region 62. Thus, when the gate bias is 0V, the depletion mode MOSFET is already in a turn-on state.

As described above, semiconductor devices used in smart cards include the EEPROMs, the resistors, and the MROMs. To reduce fabrication costs, it is desired to simplify the process for fabricating the EEPROMs, resistors, and MROMs for such devices.

SUMMARY OF THE INVENTION

It is therefore a feature of the present invention to provide semiconductor devices including nonvolatile memory transistors, resistors, and mask ROMs (MROMs).

It is another feature of the present invention to provide methods for fabricating semiconductor devices including nonvolatile memory transistors, resistors, and MROMs.

In accordance with broad aspects of the present invention, provided is a semiconductor device including a resistor having a covering gate as well as a resistive junction region and a channel junction region, of which depths are the same as that of a floating junction region. The semiconductor device comprises a device isolation layer that is formed at a predetermined region of a semiconductor substrate to define a cell active region, a resistor active region, and an MROM active region. The semiconductor device further comprises the floating junction region, the resistive junction region, and the channel junction region, which are formed in the cell active region, the resistor active region, and the MROM active region, respectively. The floating junction region, the resistive junction region, and the channel junction region are formed to the same depth. Also, the covering gate and an MROM gate are disposed to cross over the resistor active region, and the MROM active region, respectively. A memory gate and a select gate are disposed to cross over the cell active region.

Preferably, a first gate oxide layer is disposed under the covering gate, the select gate, and the memory gate. A tunnel oxide layer, which is surrounded by the first gate oxide layer, is preferably disposed under the memory gate. At this time, a thickness of the tunnel oxide layer is less than that of the first gate oxide layer. Also, a second gate oxide layer, which is thinner than the first gate oxide layer, is preferably disposed under the MROM gate.

The memory gate includes a floating gate, a gate interlayer insulation layer, and a control gate, which are sequentially stacked. The select gate includes a lower select gate, a select gate interlayer insulation layer, and an upper select gate, which are sequentially stacked. In this case, layers constituting the select gate are preferably composed of the same materials as layers constituting the memory gate. It is also preferable that the covering gate is composed of the same material layer as the select gate, and the MROM gate is composed of the same material layer as the control gate.

The floating junction region, the resistive junction region, and the channel junction region include the same impurities of the same impurity concentration.

The present invention also provides a method for fabricating a semiconductor device, which comprises forming junction regions for various purposes through a one-time ion implantation process. The method includes forming a device isolation layer at a predetermined region of a semiconductor substrate to define a cell active region, a resistor active region, and an MROM active region. A first ion implantation process is then performed, thereby forming a floating junction region, a resistive junction region, and a channel junction region in the cell active region, the resistor active region, and the MROM active region, respectively. Thereafter, a select gate, a memory gate, and a covering gate are formed on the cell active region, the resistor active region, and the MROM active region, respectively, where the first ion implantation process is implemented.

Preferably, a first gate oxide layer is formed on the cell active region, the resistor active region, and the MROM active region, before or after the first ion implantation process. Meanwhile, the first ion implantation process is implemented using impurities having a conductivity type that is different from that of the cell active region, the resistor active region and the MROM active region.

After forming the first gate oxide layer, it is preferable to additionally form a tunnel oxide layer, which is thinner than the first gate oxide layer.

The formation of the gates preferably comprises forming a first conductive layer, a first insulation layer, and a second conductive layer, which are sequentially stacked, on an entire surface of a semiconductor substrate where the first ion implantation process is implemented, then successively patterning the second conductive layer, the first insulation layer, and the first conductive layer.

In the meantime, the first conductive layer is preferably patterned at the cell active region before forming the first insulation layer, thereby forming a first conductive layer pattern having an opening, which is parallel to the cell active region.

Before forming the second conductive layer, preferably, the first conductive layer and the first insulation layer are patterned to expose a top surface of the MROM active region and a second gate oxide layer is then formed on the exposed MROM active region.

It is preferable that the floating junction region, the resistive junction region, and the channel junction region are formed at the same time.

BRIEF DESCRIPTION OF THE DRAWINGS

The above and other features and advantages of the present invention will become readily apparent from the description that follows, with reference to the accompanying drawings, in which:

FIGS. 10A through 14A are cross-sectional views for illustrating a method for fabricating a FLOTOX-type EEPROM according to a preferred embodiment of the present invention.

FIGS. 10B through 14B are cross-sectional views for illustrating a method for fabricating a resistor according to the preferred embodiment of the present invention.

FIGS. 10C through 14C are cross-sectional views for illustrating a method for fabricating an MROM transistor according to the preferred embodiment of the present invention.

DETAILED DESCRIPTION OF PREFERRED EMBODIMENTS

Figure 1:
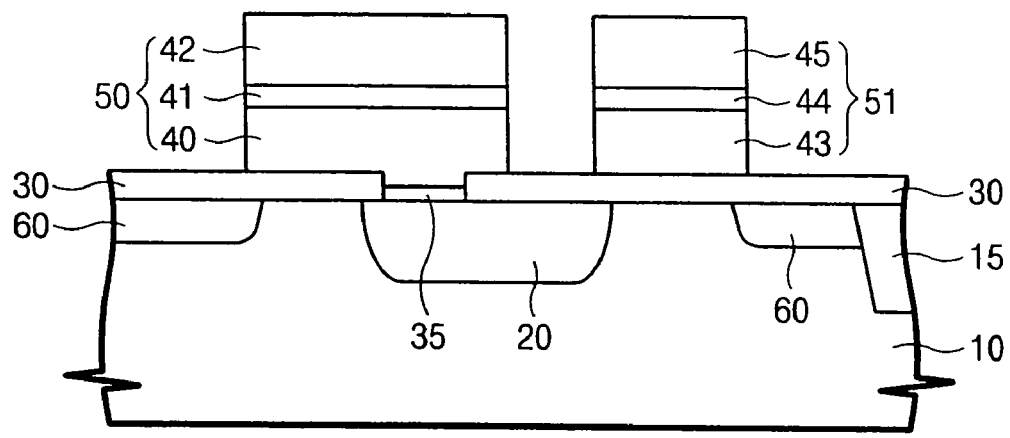
FIG. 1 is a cross-sectional view of a typical FLOTOX-type EEPROM.
Figure 2:
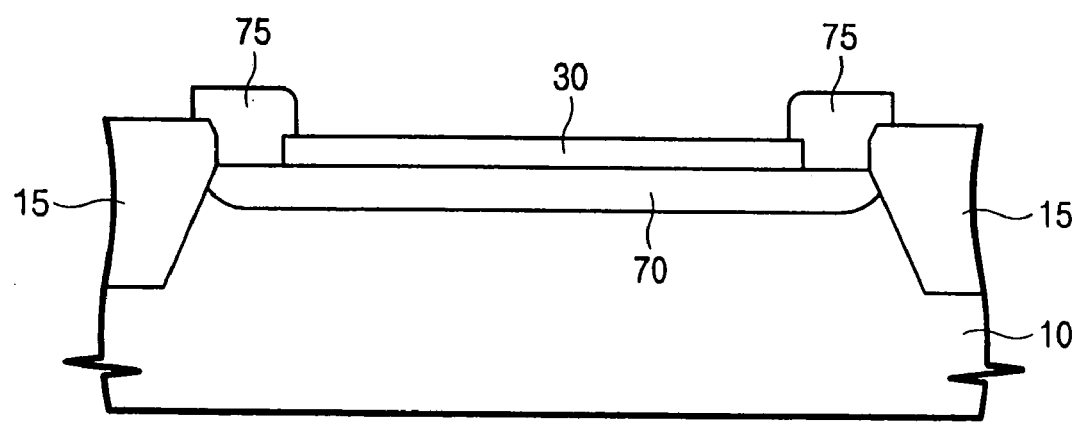
FIG. 2 is a cross-sectional view of a typical resistor of a semiconductor device.
Figure 3:
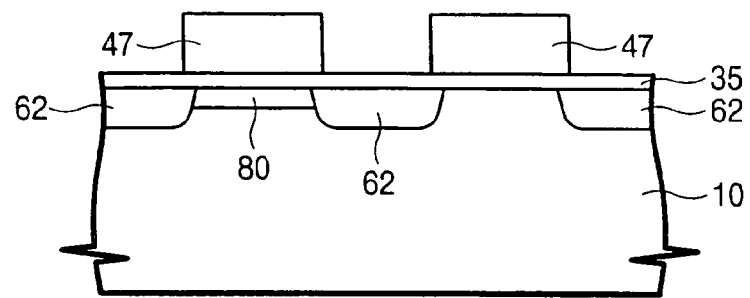
FIG. 3 is a cross-sectional view of a typical MROM transistor.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Like reference numerals refer to like elements throughout.

Figure 4:
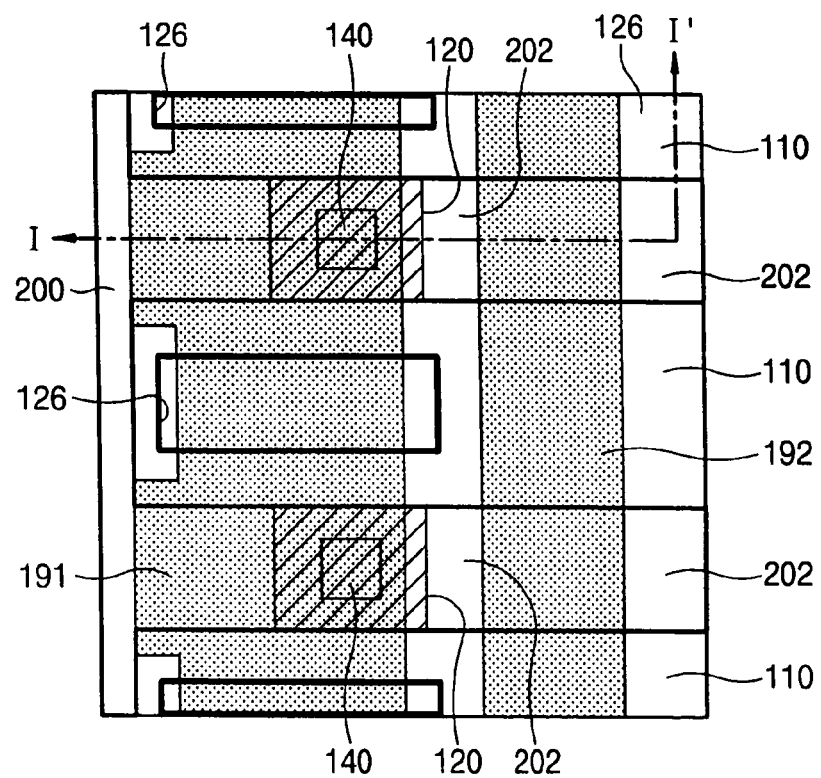
FIG. 4 is a top plan view of a FLOTOX-type EEPROM according to a preferred embodiment of the present invention.
Figure 5:
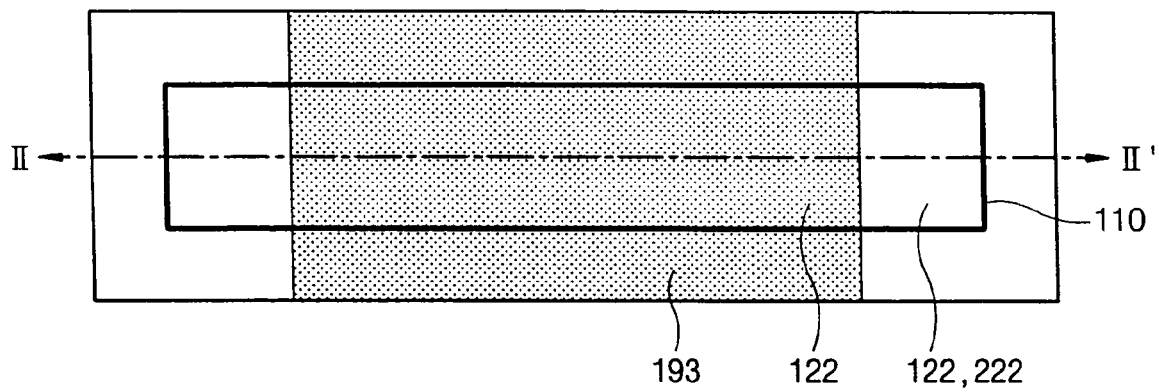
FIG. 5 is a top plan view of a resistor according to the preferred embodiment of the present invention.
Figure 6:
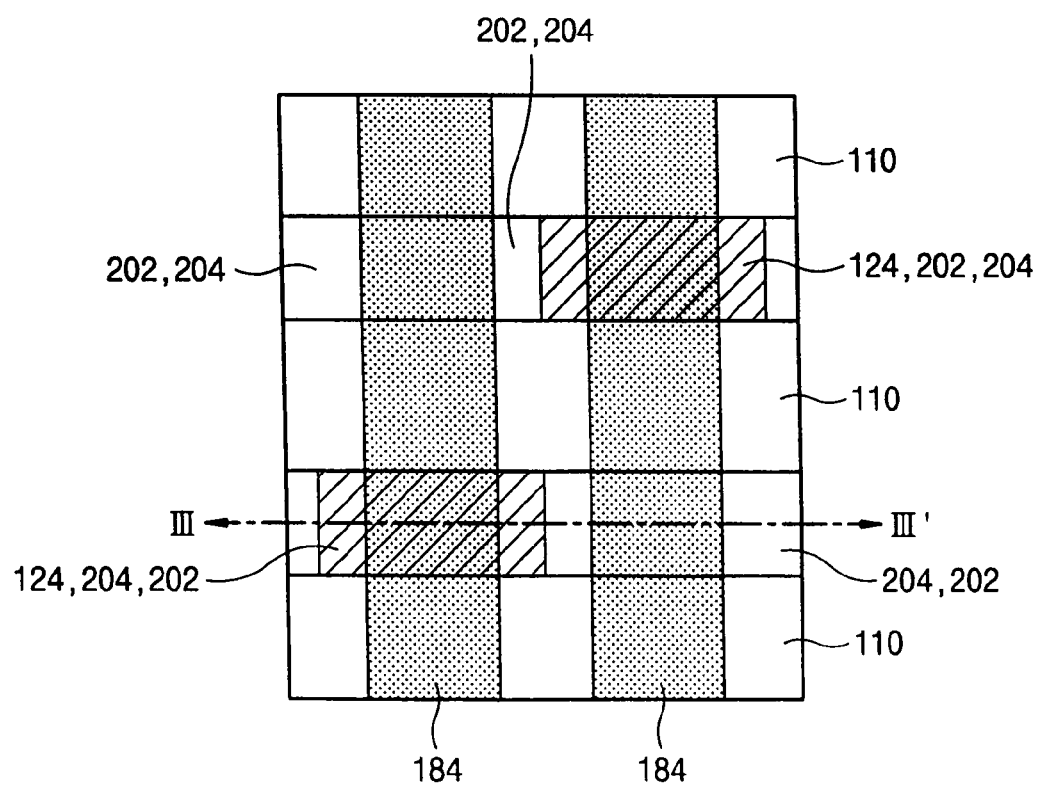
FIG. 6 is a top plan view of an MROM transistor according to the preferred embodiment of the present invention.
Figure 8:
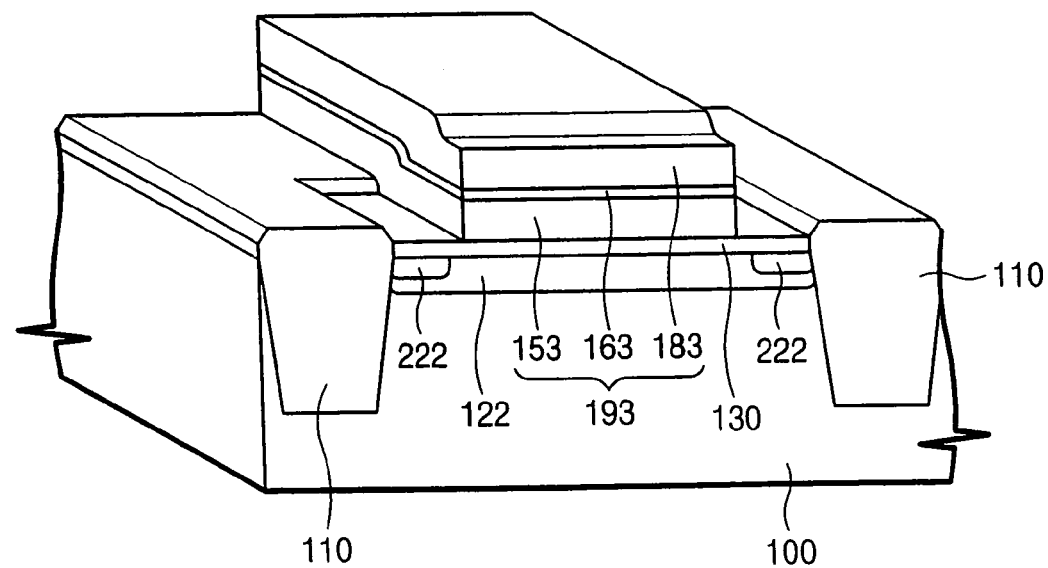
FIG. 8 is a perspective view of the resistor according to the preferred embodiment of the present invention.
Figure 9:
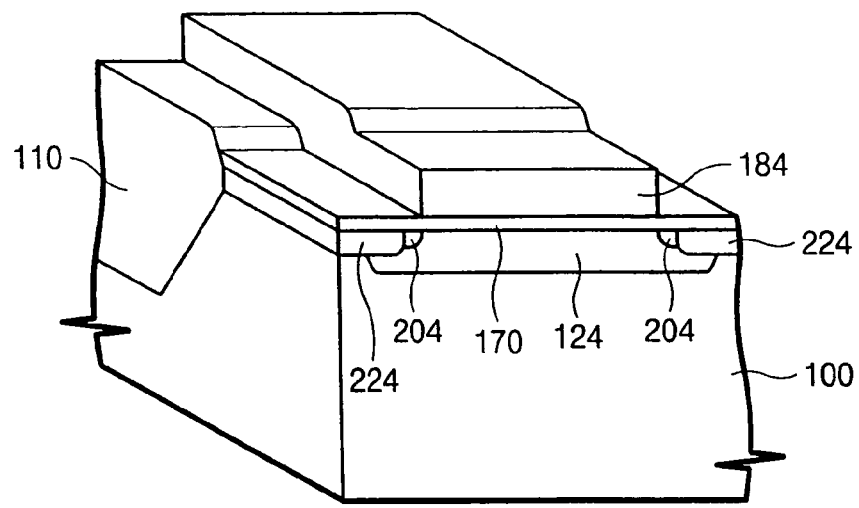
FIG. 9 is a perspective view of the MROM transistor according to the preferred embodiment of the present invention.

FIGS. 4, 5, and 6 are top plan views illustrating a FLOTOX-type EEPROM, a resistor, and an MROM transistor, respectively, according to a preferred embodiment of the present invention. In addition, FIGS. 7, 8, and 9 are perspective views illustrating the FLOTOX-type EEPROM, the resistor, and the MROM transistor, respectively, according to the preferred embodiment of the present invention.

Figure 7:
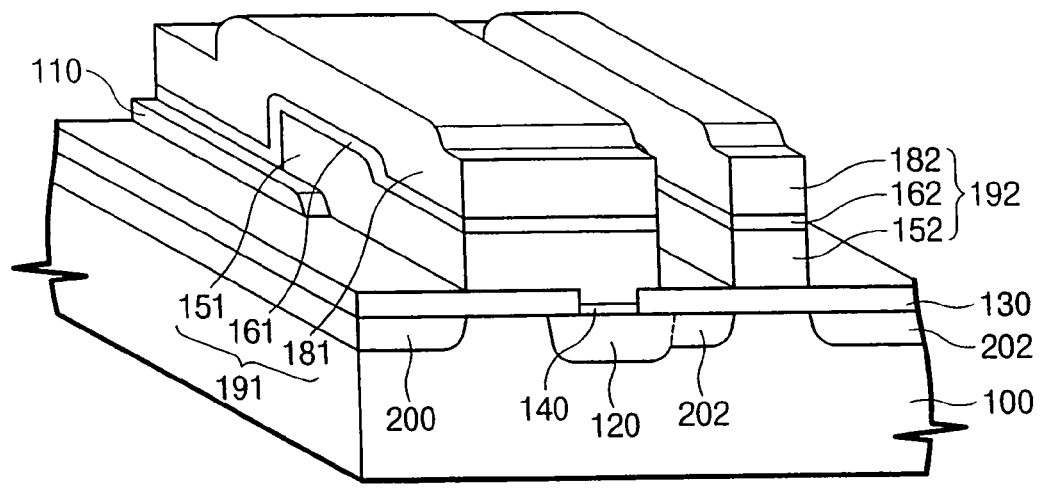
FIG. 7 is a perspective view of the FLOTOX-type EEPROM according to the preferred embodiment of the present invention.

Referring to FIGS. 4 and 7, a device isolation layer 110 is disposed at a predetermined region of a semiconductor substrate to define a cell active region where a FLOTOX-type EEPROM will be formed. A memory gate 191 and a select gate 192 are disposed to cross over the cell active region and the device isolation layer 110.

The memory gate 191 includes a floating gate 151, a gate interlayer insulation layer 161, and a control gate 181, which are sequentially stacked. The floating gate 151 crosses the cell active region so as not to be extended to adjoining cell active regions and so as to be cut off on the device isolation layer. By comparison, the gate interlayer insulation layer 161 and the control gate 181 cover the said cut floating gates 151, and also cross the cell active region and the device isolation layer 110.

The floating gate 151 preferably comprises a polysilicon layer including impurities, and the gate interlayer insulation layer 161 preferably comprises an oxide-nitride-oxide (ONO) layer. Preferably, the control gate 181 is a polysilicon layer including impurities, and a metal layer, for example, a silicide layer, as well as an insulation layer such as a silicon oxide layer, may be additionally stacked thereon.

The select gate 192 includes a lower select gate 152, a select gate interlayer insulation layer 162, and an upper select gate 182, which are sequentially stacked. It is preferable that the lower select gate 152, the select gate interlayer insulation layer 162, and the upper select gate 182 preferably comprise the same material layers as the floating gate 152, the gate interlayer insulation layer 161, and the control gate 181, respectively. Further, the lower and upper select gates 152 and 182 are electrically connected to each other in a predetermined location.

A tunnel oxide layer 140 is positioned between the memory gate 191 and the cell active region. Preferably, the tunnel oxide layer 140 has a thickness of 70 to 100 Å. A first gate oxide layer 130, which surrounds the tunnel oxide layer 140, is disposed between the memory gate 191 and the cell active region and between the select gate 192 and the cell active region. Here, the first gate oxide layer 130 is thicker than the tunnel oxide layer 140, and preferably has a thickness of 200 to 300 Å.

A floating junction region 120 is disposed in the cell active region under the tunnel oxide layer 140. At this time, the floating junction region 120 extends into the cell active region between the memory gate 191 and the select gate 192. The floating junction region 120 is, however, not formed in the entire cell active region under the memory gate 191. That is, in the cell active region under the memory gate 191, there is a region where the floating junction region 120 is not formed, which is used as a channel region of a memory transistor. The floating junction region 120 preferably includes impurities having a conductivity type are different from that of the cell active region. The concentration of the impurities in the floating junction region preferably range from $10^{18}$ to $10^{20}$ atoms/cm$^3$.

Preferably, a lightly doped source junction region 200 and a heavily doped source junction region (not shown) are disposed in the cell active region between the adjacent memory gates 191, thereby forming into an LDD structure. In addition, a lightly doped/high voltage junction region 202 is preferably disposed in the cell active region between the memory gate 191 and the select gate 192. The lightly doped/high voltage Junction region 202 is preferably additionally formed in the cell active region beside the select gate 192.

Referring to FIGS. 5 and 8, a device isolation layer 110, which is formed at the semiconductor substrate 100, defines a resistor active region. A resistive junction region 122 including impurities having a conductivity type that is different from that of the semiconductor substrate 100, is disposed in the resistor active region. A first gate oxide layer 130 is disposed on the resistive junction region 122, and a covering gate 193 is disposed on the first gate oxide layer 130 to cross the resistor active region and the device isolation layer 110.

The depth of the resistive junction region 122 is the same as that of the floating junction region 120 of the FLOTOX-type EEPROM of FIGS. 4 and 7. Also, the resistive junction region 122 includes the same impurities of the same impurity concentration as that of the floating junction region 120 of the FLOTOX-type EEPROM. Further, the first gate oxide layer 130 is preferably the same material layer as the first gate oxide layer 130 of the FLOTOX-type EEPROM, which is formed on the cell active region. In this case, the resistive junction region 122 is covered with the covering gate 193 so that the resistive junction region 122 can have a constant impurity concentration.

The covering gate 193 preferably includes a covering lower gate 153, a covering gate interlayer insulation layer 163, and a covering upper gate 183, which are sequentially stacked. It is also preferable that the covering lower gate 153, the covering gate interlayer insulation layer 163, and the covering upper gate 183 are the same material layers as the lower select gate 152, the select gate interlayer insulation layer 162, and the upper select gate 182, respectively, of the FLOTOX-type EEPROM of FIGS. 4 and 7.

A heavily doped resistor junction region 222 for connecting with an interconnection is preferably disposed in the resistive junction region 122 beside the covering gate 193. The heavily doped resistor junction region 222 includes impurities having a conductivity type that is the same as that of the resistive junction region 122.

Referring to FIGS. 6 and 9, a device isolation layer 110 is disposed at the semiconductor substrate 100 to define an MROM active region. A second gate oxide layer 170 is disposed on the MROM active region. An MROM gate 184, which crosses the MROM active region and the device isolation layer 110, is disposed on the second gate oxide layer 170. In a predetermined region of the MROM active region, a channel junction region 124 may be provided including impurities of a conductivity type that is different from that of the semiconductor substrate 100. As explained in the Background of the Invention, a depletion mode MOSFET includes the channel junction region 124, while an enhancement mode MOSFET does not include the channel junction region 124.

The depth of the channel junction region 124 is the same as that of the floating junction region 120 of the FLOTOX-type EEPROM of FIGS. 4 and 7. Also, the channel junction region 124 includes impurities of a concentration and species that are the same as those of the floating junction region 120 of the FLOTOX-type EEPROM. The MROM gate 184 is the same material layer of the same thickness as the control gate 181 and the upper select gate 182 of the FLOTOX-type EEPROM, and the covering upper gate 183 of the resistor of FIGS. 5 and 8.

Preferably, the thickness of the second gate oxide layer 170 of the MROM of FIG. 9 is less than that of the first gate oxide layer 130 of the FLOTOX-type EEPROM of FIG. 7 and the resistor of FIG. 8. In addition, lightly doped and heavily doped MROM junction regions, 204 and 224 respectively, are preferably disposed in the MROM active region beside the MROM gate 284, thereby forming an LDD structure.

FIGS. 10A through 14A, 10B through 14B, and 10C through 14C are cross-sectional views taken along lines I–I' of FIG. 4, II–II' of FIG. 5, and III–III' of FIG. 6, respectively.

Figure 10A:
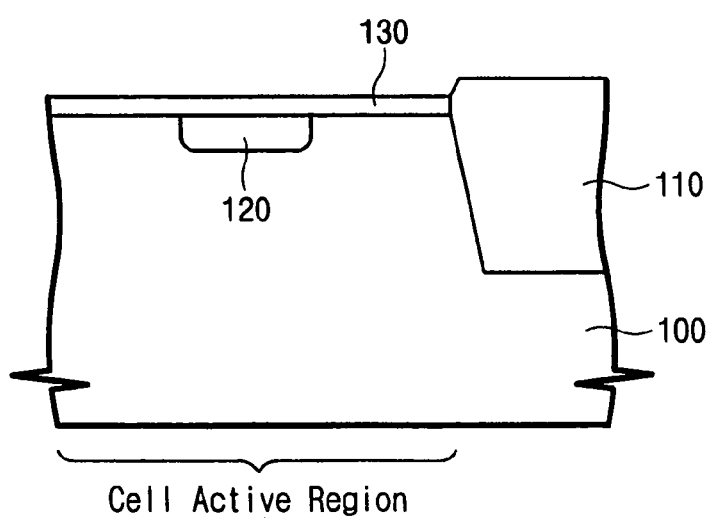
Figure 10B:
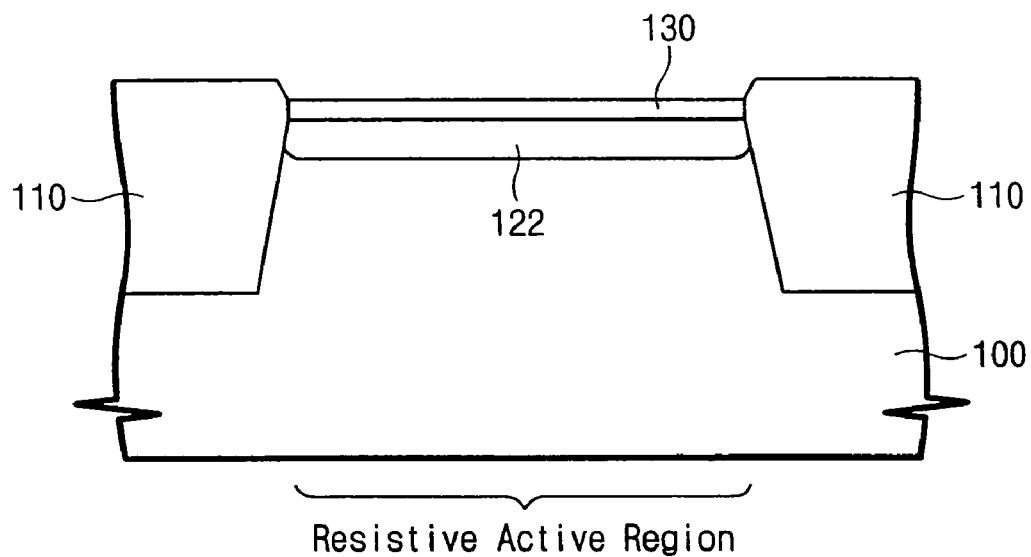
Figure 10C:
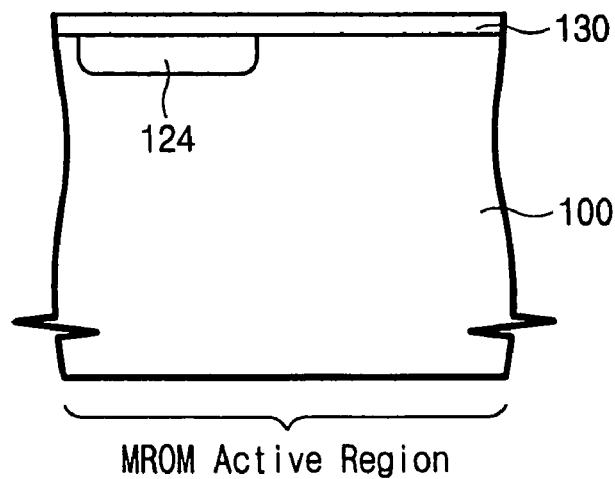

Referring to FIGS. 10A, 10B, and 10C, a device isolation layer 110 is formed in a semiconductor substrate 100 to define a cell active region, a resistor active region, and an MROM active region. The device isolation layer 110 is preferably formed using a conventional local oxidation of silicon (LOCOS) technique or using a shallow trench isolation (STI) technique.

A first photoresist pattern (not shown) is formed on the semiconductor substrate 100 having the device isolation layer 110 to expose top surfaces of predetermined regions of the cell active region, the resistor active region, and the MROM active region. Thereafter, a first ion implantation process is performed. That is, impurities of first conductivity type are doped into the semiconductor substrate 100 by using the first photoresist pattern as a mask. Thus, a floating junction region 120, a resistive junction region 122, and a channel junction region 124 are formed in the cell active region, the resistor active region, and the MROM active region, respectively. In this case, the junction regions 120, 122, and 124 are, to simplify the fabrication process, preferably formed at the same time using the first photoresist pattern. Thus, the floating junction region 120, the resistive junction region 122, and the channel junction region 124 are not only formed to the same depth, but also include impurities of the same species and concentration. Here, the impurities of first conductivity type are preferably different from the impurities included in the cell active region, the resistor active region, and the MROM active region.

The floating junction region 120 is formed in a portion of the cell active region, and preferably formed in the cell active region under a memory gate being formed in a subsequent process as well as in the cell active region between the memory gate and the select gate. The resistive junction region 122 is preferably formed over the entire surface of the resistor active region.

Meanwhile, to minimize ion channeling and crystalline defects of the semiconductor substrate during the first ion implantation process, it is preferable that a buffer layer is additionally formed on the active regions 120, 122, and 124 before forming the first photoresist pattern. The buffer layer preferably comprises, for example, a silicon oxide layer.

After removing the first photoresist pattern, a first gate oxide layer 130 is formed on the active regions 120, 122, and 124. The first gate oxide layer 130 is formed through thermal oxidization, preferably to a thickness ranging from 200 to 300 Å. The first gate oxide layer 130 may serve as a buffer layer instead of the buffer layer mentioned above. In this case, the formation of the first gate oxide layer is followed by the formation of the first photoresist pattern, the first ion implantation process, and then the removal of the first photoresist pattern.

Figure 11A:
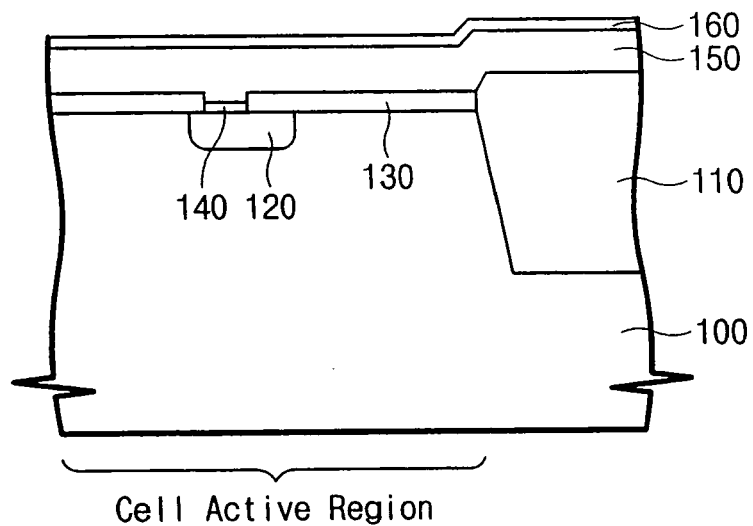
Figure 11B:
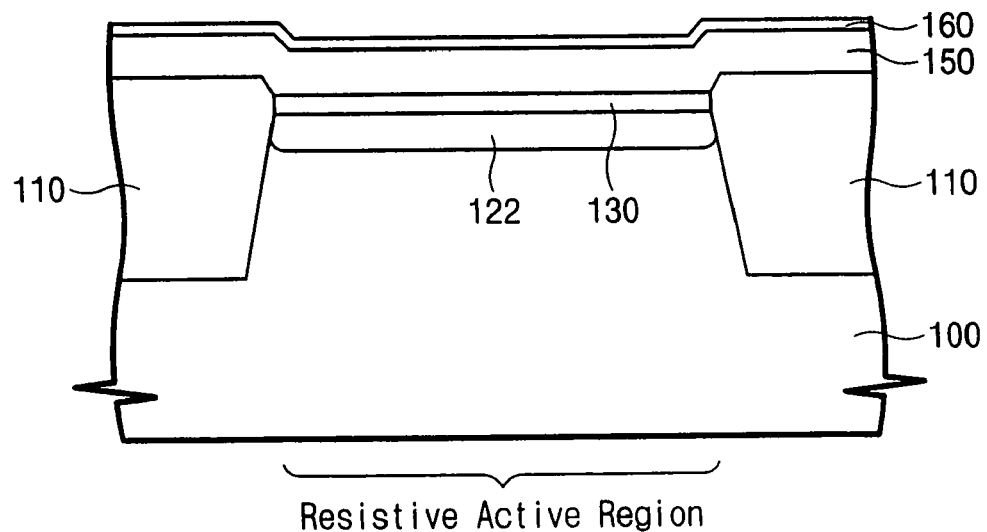
Figure 11C:
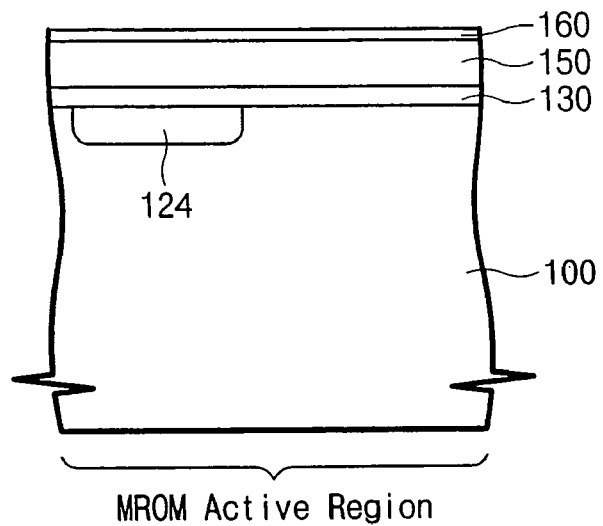

Referring to FIGS. 11A, 11B, and 11C, a second photoresist pattern (not shown) is formed on the semiconductor substrate 100 having the first gate oxide layer 130. The second photoresist pattern has an opening exposing the first gate oxide layer 130 on the floating junction region 120. By using the second photoresist pattern as a mask, the exposed first gate oxide layer 130 is patterned to expose a top surface of the floating junction region 120. Thereafter, the second photoresist pattern is removed.

A tunnel oxide layer 140 is formed on the exposed floating junction region 120. The tunnel oxide layer 140 is preferably formed through thermal oxidization, which is a well-known technique for obtaining a reliable silicon oxide layer. At this time, the tunnel oxide layer 140 is formed to a thickness that is less than that of the first gate oxide layer 130. Also, the tunnel oxide layer 140 is preferably formed to a thickness of 70 to 100 Å so as to readily induce the tunneling phenomenon. From the perspective of the top plan view, the tunnel oxide layer 140 is formed within the floating junction region 120.

A first conductive layer (not shown) is formed on an entire surface of the semiconductor substrate 100 including the tunnel oxide layer 140. The first conductive layer is preferably a polysilicon layer including impurities.

The first conductive layer is then patterned to form a first conductive layer pattern 150 having an opening (126 of FIG. 4), which exposes a portion of a top surface of the device isolation layer 110. The opening (126 of FIG. 4) is formed on the device isolation layer 110 adjacent to the cell active region, preferably in parallel with the cell active region.

A first insulation layer 160 is conformally formed on an entire surface of the semiconductor substrate 100 including the first conductive layer pattern 150. The first insulation layer 160 is preferably an ONO layer.

Figure 12A:
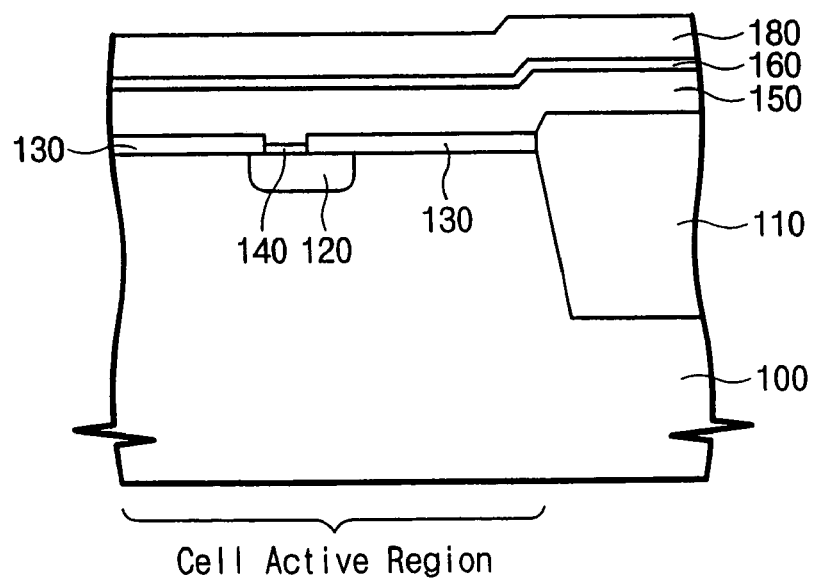
Figure 12B:
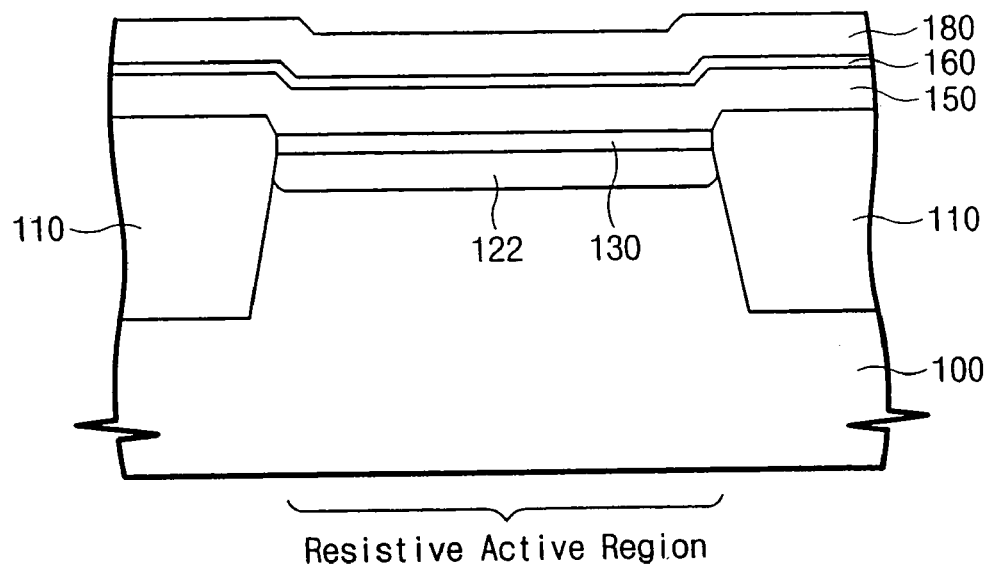
Figure 12C:
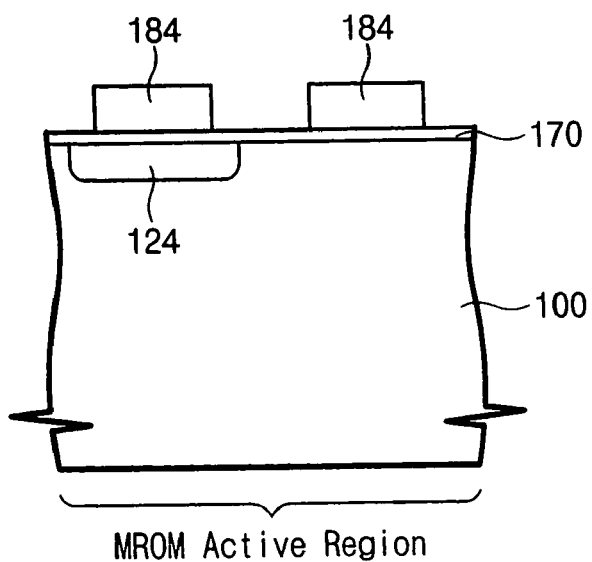

Referring to FIGS. 12A, 12B, and 12C, a third photoresist pattern (not shown), which exposes the first insulation layer 160 on the MROM active region, is formed on the first insulation layer 160. The first insulation layer 160, the first conductive layer pattern 150, and the first gate oxide layer 130 are successively patterned by using the third photoresist pattern as a mask, thereby exposing a top surface of the MROM active region. Thereafter, the third photoresist pattern is removed. It is preferable that the cell active region and the resistor active region are covered with the third photoresist pattern to prevent etching damage during the patterning process.

A second gate oxide layer 170 is formed on a top surface of the exposed MROM active region. The second gate oxide layer 170 is preferably formed to a thickness that is less than that of the first gate oxide layer 130.

A second conductive layer 180 is formed on an entire surface of the semiconductor substrate 100 including the second gate oxide layer 170. The second conductive layer 180 is preferably a polysilicon layer including impurities. A metal layer such as a silicide layer and a capping insulation layer, such as a silicon oxide layer, may be additionally stacked on the polysilicon layer.

The second conductive layer 180 is patterned to form a MROM gate 184 that crosses the MROM active region and the device isolation layer 110. The first conductive layer pattern 150, the first insulation layer 160, and the second conductive layer 180, which are formed on the cell active region and the resistor active region, are preferably not etched during the patterning process for forming the MROM gate 184. For this, it is preferable that forming a fourth photoresist pattern (not shown) covering the cell active region and the resistor active region is followed by performing an etching process to form the MROM gate 184. The fourth photoresist pattern is then removed to expose the second conductive layer 180 of the cell and resistor active regions as well as the MROM active region where the MROM gate 184 is formed.

Figure 13A:
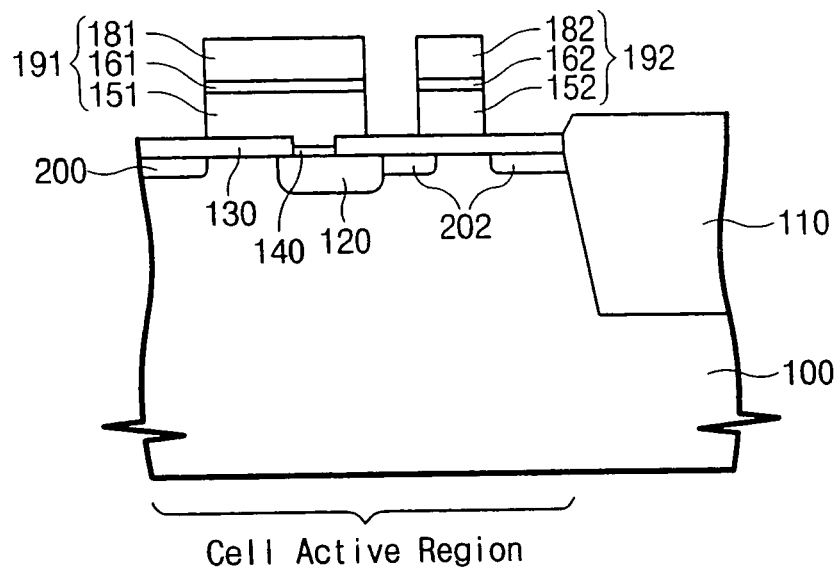
Figure 13B:
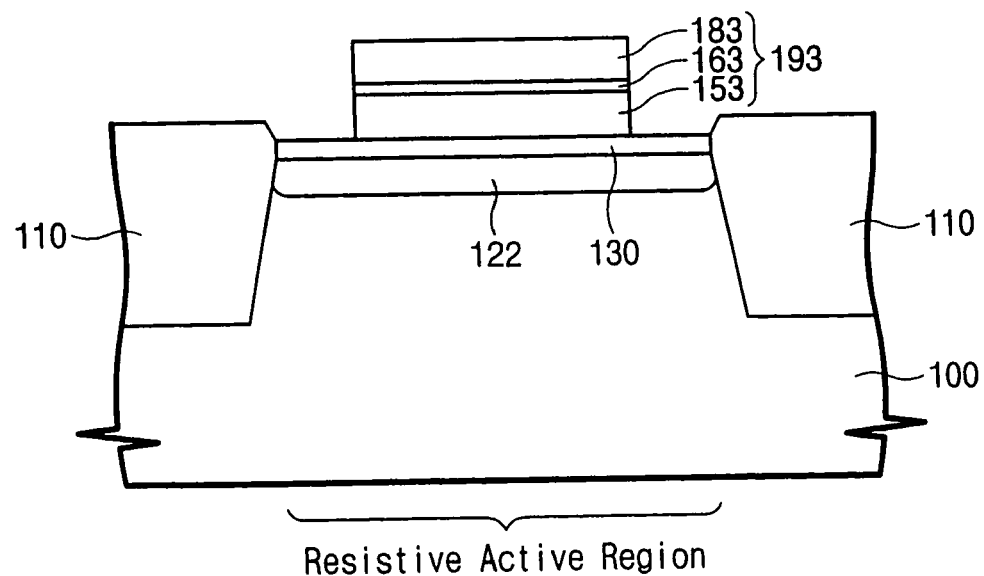
Figure 13C:
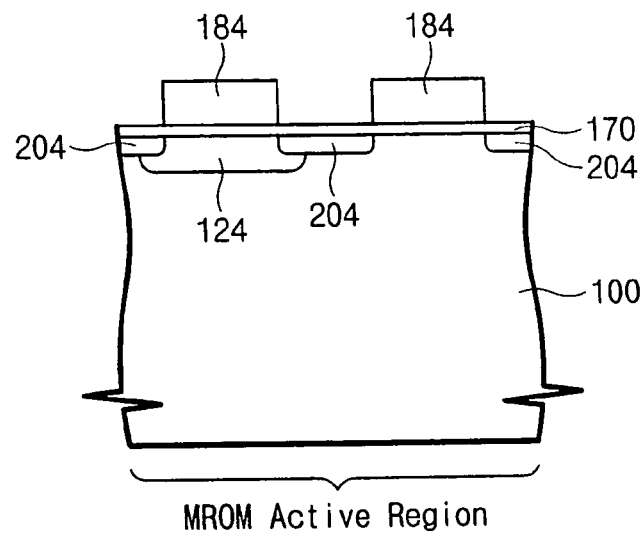

Referring to FIGS. 13A, 13B, and 13C, the exposed second conductive layer 180, the first insulation layer 160, and the first conductive layer pattern 150 are successively patterned to form a memory gate 191, a select gate 192, and a covering gate 193. At this time, the patterning process is preferably performed so as not to cause etching damage to the MROM active region where the MROM gate 184 is formed.

The memory gate 191 and the select gate 192 are formed on the cell active region and the covering gate 193 is formed on the resistor active region. The memory gate 191 includes a floating gate, a gate interlayer insulation layer 161, and a control gate 181, which are sequentially stacked. The select gate 192 includes a lower select gate 152, a select gate interlayer insulation layer 162, and an upper select gate 182, which are sequentially stacked. Also, the covering gate 193 includes a covering lower gate 153, a covering gate interlayer insulation layer 163, and a covering upper gate 183, which are sequentially stacked.

Preferably, the patterning process employs an anisotropic etch process using an etch recipe having an etch selectivity with respect to the first gate oxide layer 130. The patterning process is, referring to FIG. 4, preferably performed such that the memory gate 191 crosses the opening (126 of FIG. 4) of the first conductive layer pattern 150. Thus, the floating gate 151 is electrically insulated.

After forming the gate patterns, a series of subsequent ion implantation processes are performed to form a lightly doped source junction region 200, a lightly doped/high voltage junction region 202, and a lightly doped MROM junction region 204. The lightly doped source junction region 200 is formed in the cell active region between the adjacent memory gates 191, and the lightly doped/high voltage junction region 202 is formed in the cell active region of both sides of the select gate 192. In addition, the lightly doped MROM junction region 204 is formed in the MROM active region beside the MROM gate 184. The lightly doped source junction region 200 and the lightly doped/high voltage junction region 202 include impurities having a conductivity type that is the same as that of the floating junction region 120. The lightly doped MROM junction region 204 includes impurities having a conductivity type that is the same as that of the channel junction region 124. Since the foregoing ion implantation processes are conventional to the fabrication of the semiconductor devices, detailed description of such will be omitted herein.

Figure 14A:
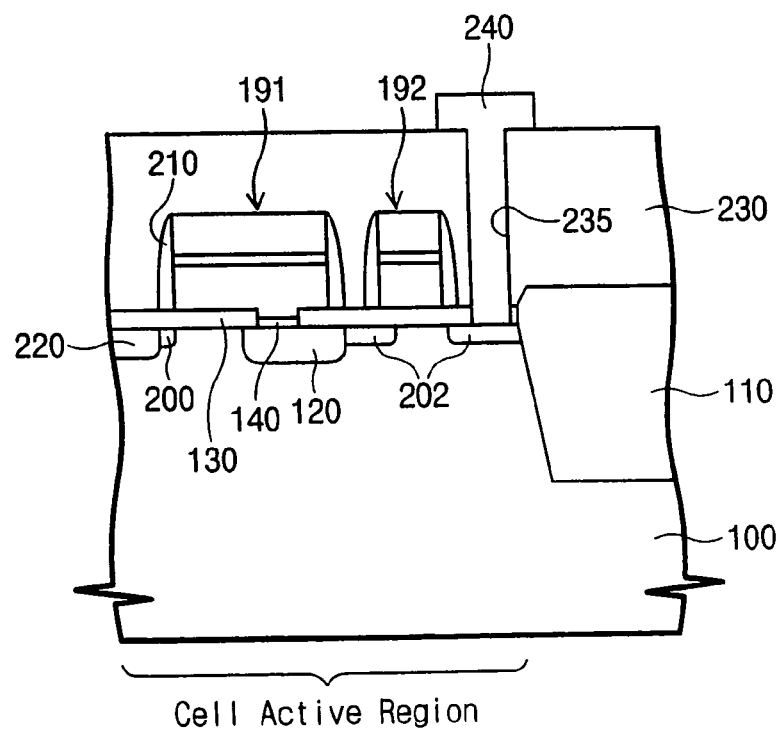
Figure 14B:
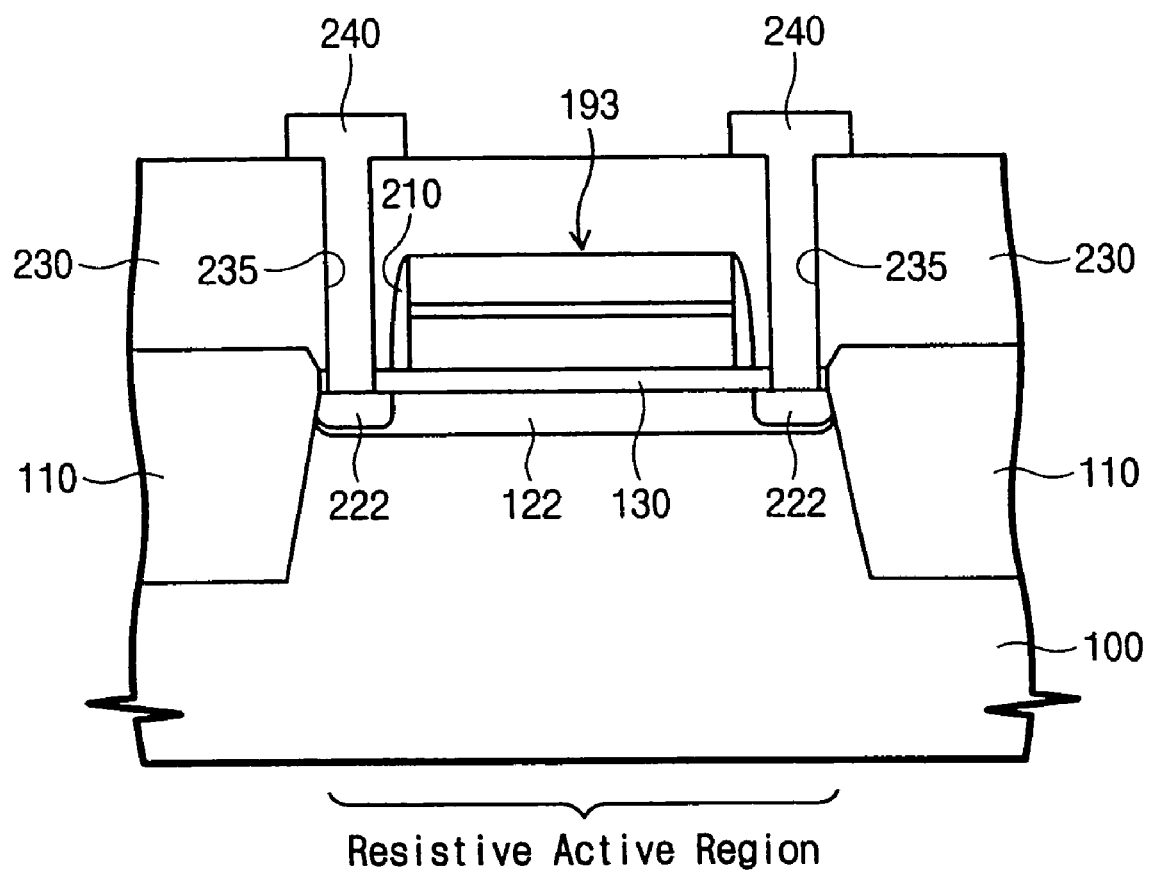
Figure 14C:
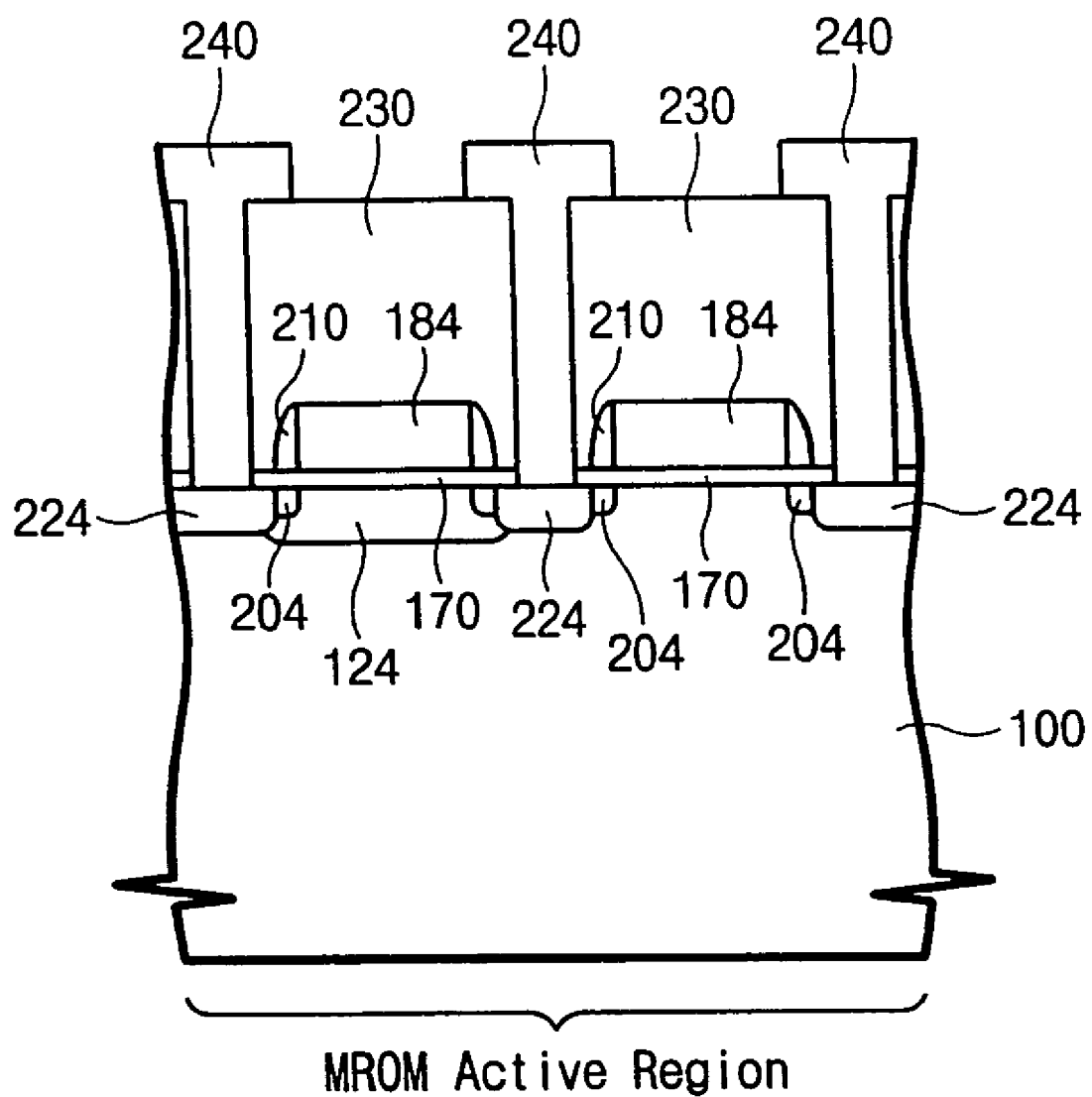

Referring to FIGS. 14A, 14B, and 14C, spacers 210 are formed on sidewalls of the memory gate 191, the select gate 192, the covering gate 193, and the MROM gate 184. Thereafter, a heavily doped source junction region 220 including impurities, of which conductivity type is the same as the lightly doped source junction region 200, is formed in the lightly doped source junction region 200 of the FLOTOX-type EEPROM. In addition, a heavily doped resistor junction region 222 is formed in the resistive junction region 122 beside the covering gate 193, and a heavily doped MROM junction region 224 is formed in the MROM active region beside the MROM gate 184. Preferably, the heavily doped resistor junction region 222 and the heavily doped MROM junction region 224 are formed together when the heavily doped source junction region 220 of the FLOTOX-type EEPROM is formed.

Next, an interlayer insulation layer 230 is formed on an entire surface of the semiconductor substrate 100 including the heavily doped junction regions. The interlayer insulation layer 230 is patterned to form an opening 235 exposing the active regions beside the gate patterns, then forming a contact conductive layer pattern 240 filling the openings 235. The processes for forming the interlayer insulation layer 230 and the contact conductive layer pattern 240 are conventional to the fabrication of the semiconductor devices, therefore, detailed descriptions of this will be omitted here.

According to the present invention, a floating junction region of a FLOTOX-type EEPROM, a resistive junction region of a resistor, and a channel junction region of an MROM are formed in a one-time photolithography process. Thus, process simplification is achieved. In addition, according to the present invention, a resistor active region is covered with a covering gate, which crosses over the resistor active region. Thus, impurities, which otherwise would be unintentionally implanted into the resistor active region, can be minimized. This makes it possible to fabricate semiconductor products with reliability and price competitiveness.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device comprising:
    a device isolation layer formed at a predetermined region, the device isolation layer defining a cell active region, a resistor active region, and an MROM active region;
    a resistive junction region formed in the resistive active region;
    a covering gate crossing the resistive junction region and the device isolation layer;
    a channel junction region formed in the MROM active region;
    a memory gate and a select gate crossing the cell active region and the device isolation layer; and
    a floating junction region formed in the cell active region under the memory gate,
    wherein the floating junction region, the resistive junction region, and the channel junction region have the same depth.

2. The device as claimed in claim 1, comprising a first gate oxide layer disposed under the covering gate, the select gate, and the memory gate.

3. The device as claimed in claim 2, comprising a tunnel oxide layer disposed under the memory gate, the tunnel oxide layer being surrounded by the first gate oxide layer.

4. The device as claimed in claim 3, wherein a thickness of the tunnel oxide layer is less than that of the first gate oxide layer.

5. The device as claimed in claim 2, wherein a second gate oxide layer, having a thickness less than that of the first gate oxide layer, is disposed under the MROM gate.

6. The device as claimed in claim 1, wherein the memory gate includes a floating gate, a gate interlayer insulation layer, and a control gate, which are sequentially stacked.

7. The device as claimed in claim 1, wherein the select gate includes a lower select gate, a select gate interlayer insulation layer, and an upper select gate, which are sequentially stacked.

8. The device as claimed in claim 1, wherein layers constituting the select gate are the same material layers as layers constituting the memory gate.

9. The device as claimed in claim 1, wherein layers constituting the covering gate are the same material layers as layers constituting the select gate.

10. The device as claimed in claim 6, wherein the MROM gate is the same material layer as the control gate.

11. The device as claimed in claim 1, wherein the floating junction region, the resistive junction region, and the channel junction region include the same impurities.

12. The device as claimed in claim 1, wherein the floating junction region, the resistive junction region, and the channel junction region have the same impurity concentration.

* * * * *